US009706025B2

United States Patent
Ikeda et al.

(10) Patent No.: US 9,706,025 B2
(45) Date of Patent: Jul. 11, 2017

(54) TRANSPORTABLE ELECTRONIC DEVICE

(71) Applicant: TEAC Corporation, Tokyo (JP)

(72) Inventors: Tomohiro Ikeda, Tokyo (JP); Eiji Ueda, Tokyo (JP)

(73) Assignee: TEAC Corporation, Tokyo (JP)

( * ) Notice: Subject to any disclaimer, the term of this patent is extended or adjusted under 35 U.S.C. 154(b) by 69 days.

(21) Appl. No.: 14/616,412

(22) Filed: Feb. 6, 2015

(65) Prior Publication Data

US 2015/0245517 A1 Aug. 27, 2015

(30) Foreign Application Priority Data

Feb. 21, 2014 (JP) .................................. 2014-031901

(51) Int. Cl.
| H04M 1/02 | (2006.01) |
| G06F 3/0354 | (2013.01) |
| H05K 7/14 | (2006.01) |
| G06F 1/16 | (2006.01) |

(52) U.S. Cl.
CPC ........... H04M 1/0285 (2013.01); G06F 1/163 (2013.01); G06F 3/03545 (2013.01); H05K 7/1434 (2013.01)

(58) Field of Classification Search
CPC .. G06F 1/163; G06F 3/03545; H04M 1/0285; H05K 7/1434
See application file for complete search history.

(56) References Cited

U.S. PATENT DOCUMENTS

| 4,542,442 | A | * | 9/1985 | Drexler | .................... | H05K 7/18 |
| | | | | | | 361/784 |
| 5,674,076 | A | * | 10/1997 | Billings | ................... | G10H 1/34 |
| | | | | | | 381/345 |
| 5,754,645 | A | * | 5/1998 | Metroka | ............... | G06F 3/0233 |
| | | | | | | 345/156 |
| 7,076,272 | B2 | * | 7/2006 | Ikeda | ....................... | H01Q 1/24 |
| | | | | | | 455/556.1 |
| 7,787,912 | B2 | * | 8/2010 | Saila | ................... | H04M 1/0216 |
| | | | | | | 455/550.1 |
| 8,773,864 | B2 | * | 7/2014 | Rapp | .................... | H05K 7/1434 |
| | | | | | | 361/752 |
| 2004/0080400 | A1 | * | 4/2004 | Liguori | .................. | B43K 29/08 |
| | | | | | | 340/321 |
| 2007/0041770 | A1 | * | 2/2007 | Galeev | ................. | G06F 3/0219 |
| | | | | | | 400/472 |

(Continued)

FOREIGN PATENT DOCUMENTS

JP 2003231426 A 8/2013

Primary Examiner — Adrian S Wilson
Assistant Examiner — Abhishek Rathod
(74) Attorney, Agent, or Firm — Seed Intellectual Property Law Group LLP

(57) ABSTRACT

There is provided a transportable electronic device in which a configuration related to a protective cover can be simplified. A transportable digital photo frame includes a cylindrical main unit that is divided into four areas along the circumferential direction, and a tubular cover that houses at least a part of the main unit to protect the circumferential surface of the main unit, the tubular cover having an opening formed in its circumferential surface for exposing one area to the outside. The tubular cover is rotatable relative to the main unit so that the areas protected by the tubular cover can be switched.

10 Claims, 6 Drawing Sheets

(56) References Cited

U.S. PATENT DOCUMENTS

| | | | | |
|---|---|---|---|---|
| 2009/0149219 A1* | 6/2009 | Rhee | .................. | H04M 1/0285 |
| | | | | 455/557 |
| 2011/0267316 A1* | 11/2011 | Kim | ..................... | G06F 1/1639 |
| | | | | 345/175 |
| 2015/0283323 A1* | 10/2015 | Young | ................. | A61M 5/2033 |
| | | | | 604/182 |

* cited by examiner

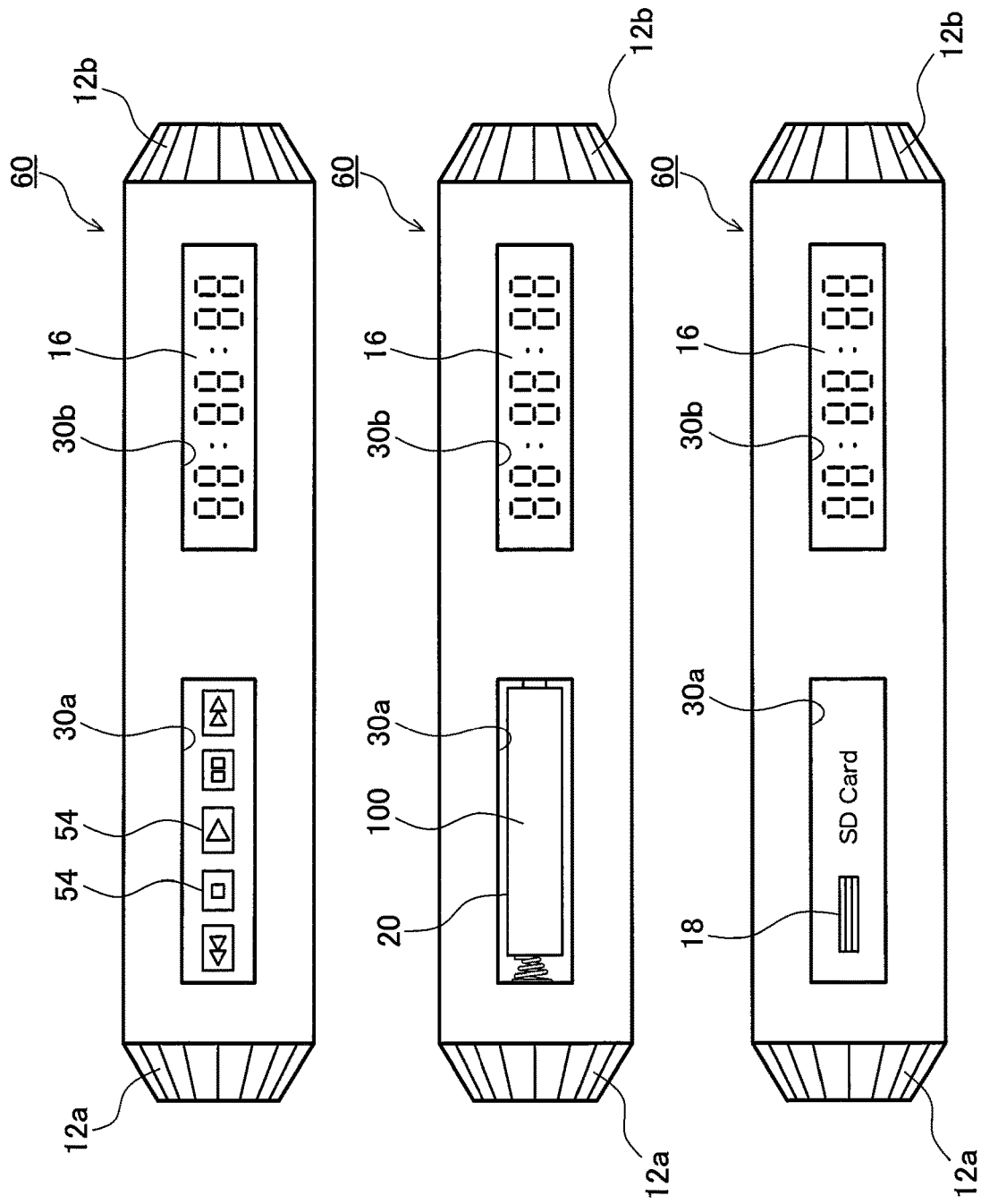

TRANSPORTABLE ELECTRONIC DEVICE

PRIORITY INFORMATION

This application claims priority to Japanese Patent Application No. 2014-031901 filed on Feb. 21, 2014, which is incorporated herein by reference in its entirety.

TECHNICAL FIELD

The present invention relates to a transportable electronic device that can be carried around freely.

BACKGROUND ART

Conventionally, electronic devices that are carried around and used, such as portable music players, digital cameras, and transportable digital photo frames, are widely known. On the surfaces of such electronic devices, there are provided elements such as a display, operation buttons, and a battery placement part for power supply. As a transportable electronic device needs to be carried around, as appropriate, protective covers for protecting the display, the operation buttons, and the battery placement part are required. However, providing separate protective covers for each of the display, the operation buttons, and the battery placement part results in drawbacks such as an increase in the number of components, a cost increase, and degradation in usability.

Here, JP 2003-231426 A discloses a function selection switching device, which is for switching functions of a vehicle-mounted apparatus, and which has a substantially cylindrical shape. This function selection switching device includes a cylindrical indicator member on which a plurality of titles of functions are listed along the circumferential direction, and this indicator member is housed inside a cylindrical container member having a window formed therein. By rotating the indicator member relative to the container member, information indicated through the window is switched, and the function of the vehicle-mounted apparatus is switched to a function in accordance with the indicated information.

However, the technique of JP 2003-231426 A assumes application to a vehicle-mounted electronic apparatus, and does not assume application to a transportable electronic device that is carried around freely. Furthermore, the technique of JP 2003-231426 A is directed only to the object of switching the indicated information, and is not directed to any object related to protection of the display and other components.

In other words, conventionally, a technique for simplifying a configuration related to a protective cover in a transportable electronic device has not been available. An object of the present invention is to provide a transportable electronic device in which a configuration related to a protective cover can be simplified.

SUMMARY OF THE INVENTION

A transportable electronic device according to the present invention comprises a cylindrical main unit that is divided into two or more areas along a circumferential direction, and a tubular cover that houses at least a part of the main unit and protects a circumferential surface of the main unit, the tubular cover having an opening formed in its circumferential surface for exposing one or more of said areas to the outside. The tubular cover is rotatable relative to the main unit so that an area to be protected by the tubular cover can be switched.

According to a preferred aspect, the main unit has at least a blank area in which no protection target element is arranged and which can be exposed to the outside via the opening when the transportable electronic device is carried around.

According to another preferred aspect, the main unit has two or more protection target areas in each of which a protection target element is arranged, and the tubular cover functions as a protective cover that simultaneously protects said two or more protection target areas.

According to another preferred aspect, the main unit is provided in a plural number and arranged adjacently along an axial direction of the tubular cover. Further, in the tubular cover, respective openings corresponding to each of the plurality of main units are provided adjacently along the axial direction.

According to the present invention, a configuration is provided in which a cylindrical tubular cover capable of being rotated relative to a cylindrical main unit is used to protect a circumferential surface of the main unit. With this configuration, it is possible to switch a portion protected by one tubular cover, so that the need to provide separate protective covers for each of different portions can be obviated, whereby a configuration related to a protective cover can be simplified.

BRIEF DESCRIPTION OF THE DRAWINGS

Preferred embodiments of the present invention will be described in detail with reference to the following figures, wherein:

FIGS. 7A to 7C are schematic front views of a portable audio player according to a third embodiment of the present invention.

DESCRIPTION OF EMBODIMENTS

Figure 1:
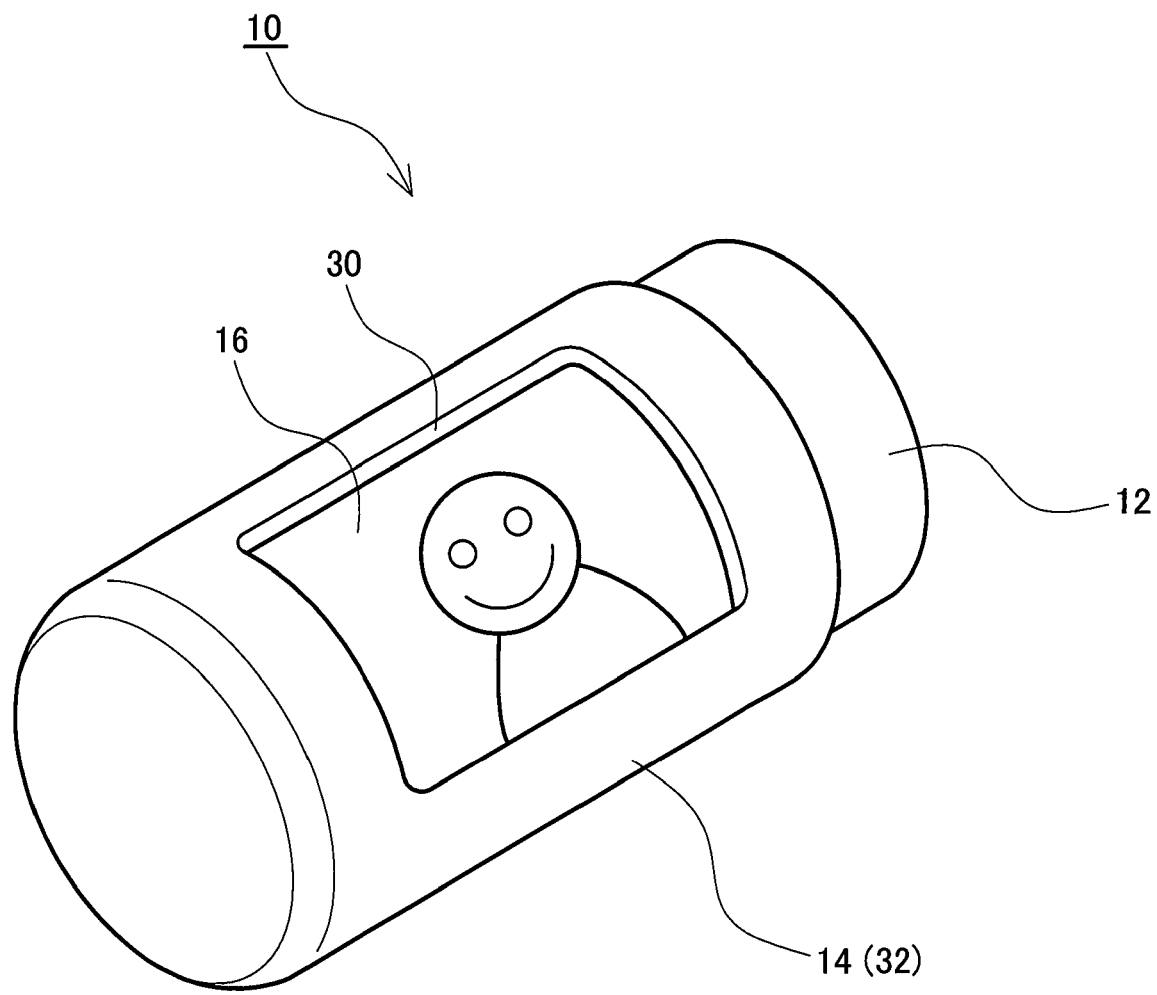
FIG. 1 is a schematic perspective view of a transportable digital photo frame according to a first embodiment of the present invention.
Figure 2:
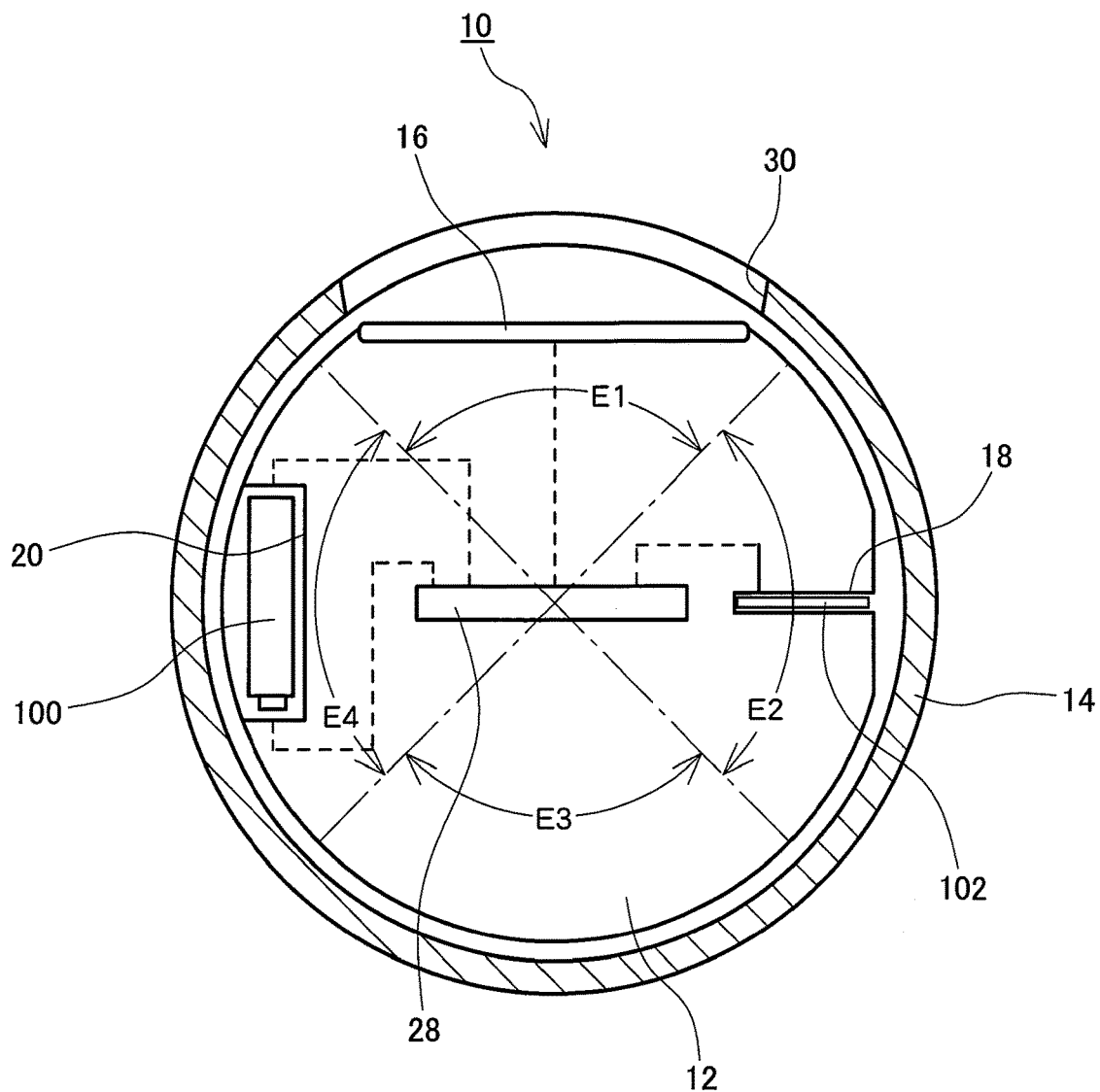
FIG. 2 is a cross-sectional view of the digital photo frame.

Embodiments of the present invention are now described with reference to the drawings. FIG. 1 is a schematic perspective view of a transportable digital photo frame 10 according to an embodiment of the present invention. FIG. 2 is a schematic cross-sectional view of the digital photo frame 10.

The digital photo frame 10 is a device for displaying photograph data recorded on a recording medium 102 such as an SD memory card. The digital photo frame 10 according to the present embodiment is broadly divided into a cylindrical main unit 12 and a cylindrical tubular cover 14 attached to the outer periphery of the main unit 12. The main unit 12 is cylindrical, and, in its circumferential surface, a display 16 for displaying photograph data, a medium placement hole 18 in which a recording medium 102 is inserted and fitted, and a battery placement hole 20 in which a battery 100 is placed and fitted are provided while being spaced from each other in the circumferential direction. Further, a circuit board 28 that connects electrically to the display 16, the battery 100, and the recording medium 102 is provided on the inside of the main unit 12.

In the present embodiment, the circumferential surface of the main unit 12 is divided along the circumferential direction into four equal areas E1~E4, and the display 16, the medium placement hole 18, and the battery placement hole 20 are arranged in different ones of these areas. In the following, the area in which the display 16 is arranged is referred to as a display area E1, the area in which the medium placement hole 18 is arranged is referred to as a medium placement area E2, the area in which the battery placement hole 20 is formed is referred to as a battery placement area E4, and the area in which no element is arranged is referred to as a blank area E3.

The tubular cover 14 is a tubular body in which a first end is closed and a second (the other) end is open. This tubular cover 14 is shorter than the main unit 12, and a second end of the main unit 12 projects from the second end of the tubular cover 14. By rotating the tubular cover 14 in the circumferential direction while holding the projected part of the main unit 12, the tubular cover 14 can be rotated relative to the main unit 12. To allow this rotating movement, the tubular cover 14 and the main unit 12 have structures shown in FIGS. 3 and 4.

Figure 3:
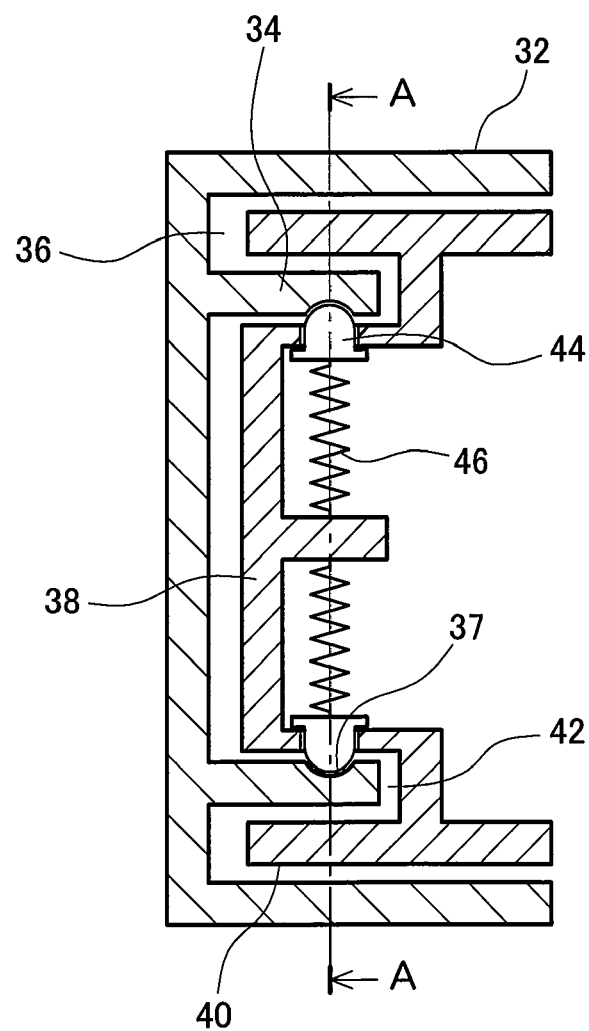
FIG. 3 is a cross-sectional view of a first end side of the digital photo frame.
Figure 4:
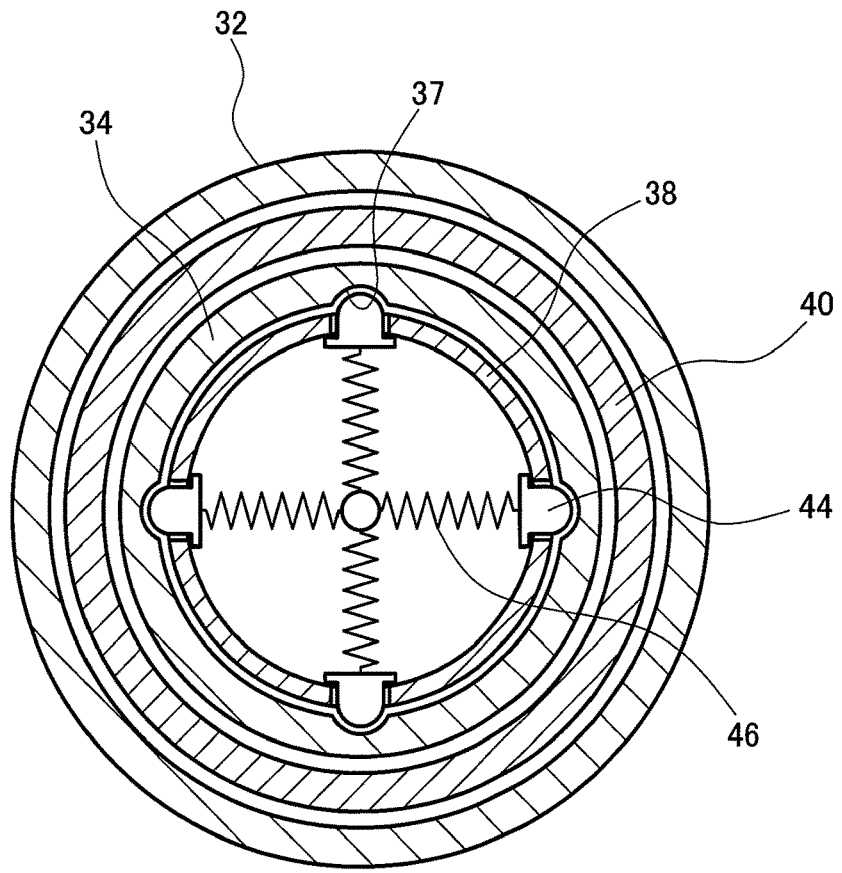
FIG. 4 is a cross-sectional view taken along line A-A in FIG. 3.

FIG. 3 is a longitudinal sectional view of the first end side of the digital photo frame, and FIG. 4 is a view showing cross-section A-A of the tubular cover 14. As shown in FIG. 3, in the tubular cover 14, an annular cover-side rib 34 arranged concentrically with an outer peripheral wall 32 protrudes from the first end of the tubular cover 14, and a cover-side guide groove 36 is formed between the cover-side rib 34 and the outer peripheral wall 32. Further, at the first end surface of the main unit 12, there are provided a cylindrical portion 38 that is arranged on the inside of the cover-side rib 34, and an annular main-unit-side rib 40 inserted into the cover-side guide groove 36. A main-unit-side guide groove 42, which receives the cover-side rib 34 therein, is formed between the cylindrical portion 38 and the main-unit-side rib 40. In the cylindrical portion 38, a total of four through-holes into and out of which a latch member 44 moves are formed at intervals of 90 degrees. The latch member 44 comprises members having substantially spherical tips. The latch member 44 is biased in the radially outward directions by means of springs 46. In the inner peripheral surface of the cover-side rib 34, a total of four latching recesses 37 for receiving the tips of the latch member 44 are formed at intervals of 90 degrees.

In the digital photo frame 10 having the above-described structure, when a user rotates the tubular cover 14 in the circumferential direction while holding the main unit 12, the tubular cover 14 is guided by the guide grooves 36, 42 and is rotated about the central axis of the tubular cover 14. Further, every time the tubular cover 14 is rotated relative to the main unit 12 by 90 degrees, the latch member 44 fits into the latching recesses 37 and thereby stops the rotation temporarily.

Here, as can be seen in FIGS. 1 and 2, an opening 30 is formed in the outer peripheral wall 32 of the tubular cover 14. As necessary, the user rotates the tubular cover 14 relative to the main unit 12 to change the position of this opening 30, and thereby switches the function of the digital photo frame 10. For example, when the user wishes to view photograph data, the user positions the opening 30 in the display area E1. When the user wishes to replace the battery, the user positions the opening 30 in the battery placement area E4. When the user wishes to replace the recording medium 102, the user positions the opening 30 in the medium placement area E2. Further, when carrying around the digital photo frame 10, the user positions the opening 30 in the blank area E3, so that the display area E1, the battery placement area E4, and the medium placement area E2 are covered and protected by the outer peripheral wall 32.

In other words, according to the present embodiment, only one of the four areas provided on the main unit 12 is exposed to the outside via the opening 30, and the other areas are covered and protected by the outer peripheral wall 32 of the tubular cover 14. Further, by rotating the tubular cover 14, the areas covered and protected by the outer peripheral wall 32 of the tubular cover 14 can be changed as appropriate. With this configuration, the need to provide separate protective cover members for each of the areas can be obviated, so that the number of components can be reduced greatly.

More specifically, in the digital photo frame 10, the medium placement hole 18 for receiving a recording medium and the battery placement hole 20 for receiving a battery are necessary elements. At times other than during operations to attach and detach a recording medium and a battery, such placement holes need to be covered and protected by some cover in order to prevent unintended dropping of the recording medium and the battery and to prevent entry of dust. Further, in a transportable digital photo frame, a cover member for covering and protecting a display is also necessary in order to avoid damaging the display when the digital photo frame is carried around.

In a conventional transportable digital photo frame, separate cover members are provided for each of the protection target elements such as the medium placement hole, the battery placement hole, and the display. However, providing separate cover members for each of the protection target elements results in an increase in the number of components, which leads to a cost increase. Further, a large number of conventional cover members include a hinge structure or a claw structure to enable opening and closing with respect to the main unit. In general, such a hinge structure and a claw structure have extremely fine parts, so that those structures are damaged and worn out rather easily. In other words, in a conventional digital photo frame, separate cover members that become damaged and worn out easily must be provided for each of the protection target elements, and therefore, disadvantageously, the number of components and the cost are increased, and damages tend to occur.

To avoid these problems, according to the present embodiment, the tubular cover 14 that is rotatable relative to the main unit 12 is provided, and the tubular cover 14 serves as a protective cover for covering and protecting the medium placement hole 18, the battery placement hole 20, and the display 16. In this configuration, one tubular cover 14 can cover and protect a plurality of areas (protection target elements), so that the need to provide separate protective cover members for each of the areas is obviated, and the number of components can be reduced. Further, as can be understood from the above descriptions, in the present embodiment, the portion protected by the tubular cover 14 can be switched by simply rotating the tubular cover 14 relative to the main unit 12. That is to say, without providing any hinge structure or claw structure, it is possible to switch between a protecting state in which the protection target elements (the medium placement hole 18, the battery placement hole 20, and the display 16) are protected and an exposing state in which a protection target area is exposed to outside. As a result, parts that tend to be damaged and worn out easily such as a hinge structure and a claw structure can be eliminated.

Furthermore, in the present embodiment, the main unit 12 is provided with the blank area E3 in which absolutely no protection target element is arranged. When carrying around the digital photo frame, by having the opening 30 positioned in this blank area E3, it is possible to avoid exposing the protection target elements (the medium placement hole 18, the battery placement hole 20, and the display 16) to the outside.

In order to prevent entry of foreign objects into the gap between the outer peripheral wall 32 of the tubular cover 14 and the outer peripheral surface of the main unit 12, a sealing member made of rubber or the like may be provided at the surrounding edge of the opening 30. Further, a sensor for detecting the rotation angle of the tubular cover 14 may be provided along with a switch and the like, and it may be configured such that the operation status of the digital photo frame 10 is switched in accordance with the rotation angle of the tubular cover 14. For example, the power may be turned on only when the opening 30 is positioned in the display area E1, and the power may be turned off automatically when the opening 30 is positioned in the other areas. Further, although the circumferential surface of the main unit 12 is divided into four areas in the present embodiment, the number of equally divided areas may be increased or decreased according to the number of function elements to be arranged. Naturally, the function elements to be arranged and the order of arrangement thereof can be changed according to product format.

Figure 5:
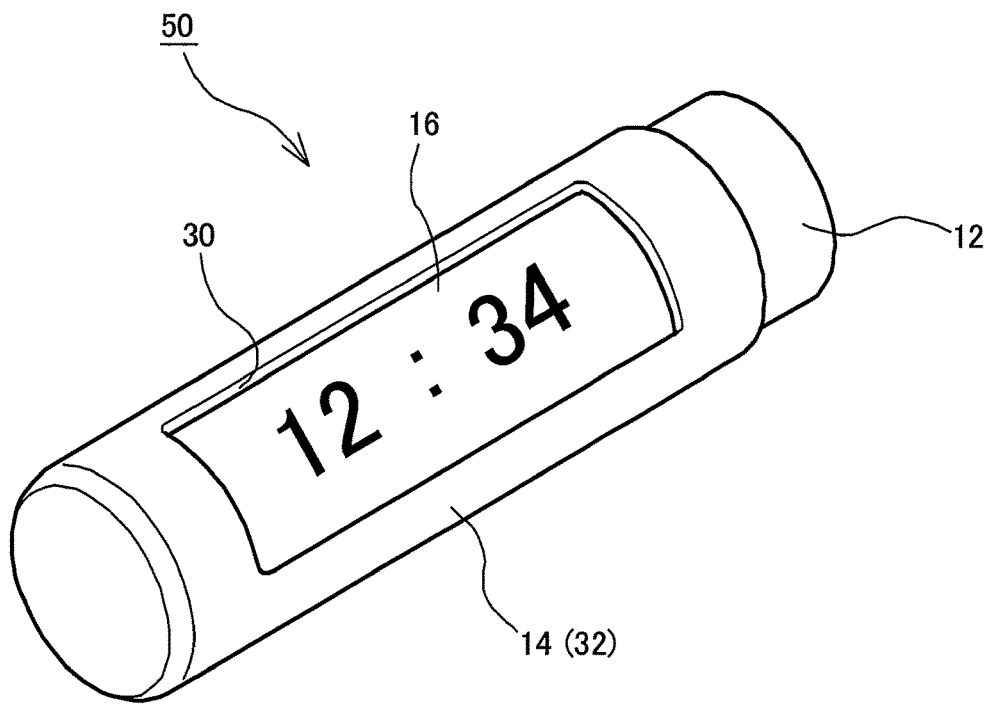
FIG. 5 is a schematic perspective view of a transportable radio according to a second embodiment of the present invention.
Figure 6:
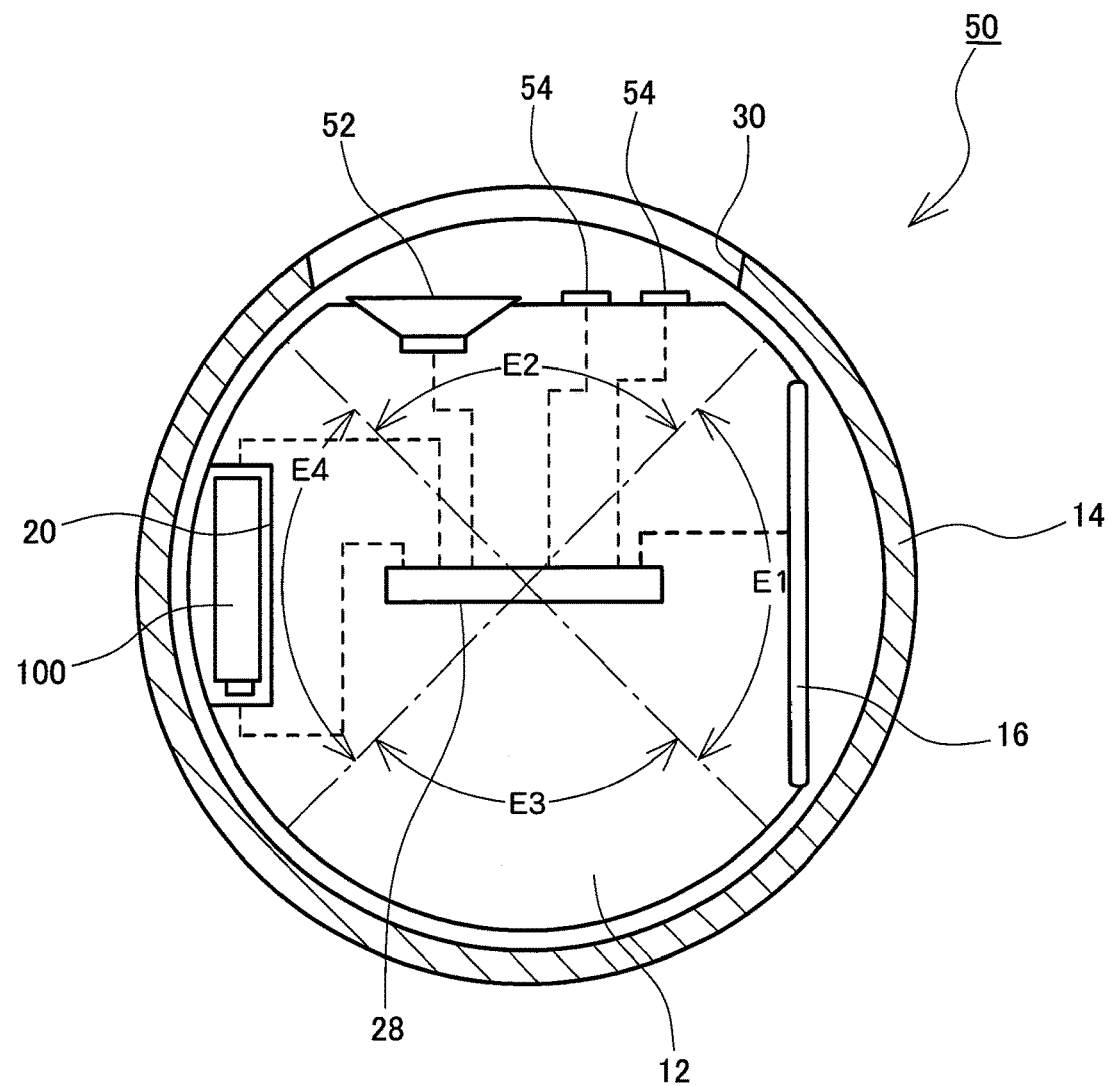
FIG. 6 is a cross-sectional view of the transportable radio.

Another embodiment of the present invention is described next with reference to FIGS. 5 and 6. FIG. 5 is a schematic perspective view of a transportable radio 50 according to a second embodiment. FIG. 6 is a schematic cross-sectional view of the transportable radio 50. Similar to the first embodiment, this transportable radio 50 includes a cylindrical main unit 12 and a cylindrical tubular cover 14. The circumferential surface of the main unit 12 is divided into four areas; i.e., a display area E1, an operation area E2, a blank area E3, and a battery placement area E4. In the display area E1, a display 16 for displaying information such as the time and a receiving frequency (channel frequency) is arranged. The operation area E2 contains a speaker 52 for outputting audio of a radio broadcast, and various operation buttons 54. Similar to the first embodiment, an opening 30 for exposing only one of the areas to outside is formed in the tubular cover 14, and the position of this opening 30 can be changed by rotating the tubular cover 14 relative to the main unit 12. By the rotation of the tubular cover 14, a portion protected by the tubular cover 14 can be switched as appropriate.

In other words, also in the second embodiment, a plurality of protection target elements can be protected using a single tubular cover 14, and easily breakable structures such as a hinge structure and a claw structure can be eliminated, similar to in the first embodiment. The number of equally divided areas, the function elements to be arranged, and the order of arrangement thereof may be changed according to product format, as in the first embodiment.

A third embodiment of the present invention is described next with reference to FIGS. 7A to 7C. FIGS. 7A to 7C show front views of a portable audio player 60 according to the third embodiment.

In this portable audio player 60, two main units; namely, a first main unit 12a and a second main unit 12b, are housed inside a cylindrical tubular cover 14. Both of the first main unit 12a and the second main unit 12b have a cylindrical shape. The first main unit 12a and the second main unit 12b are arranged adjacently along the axial direction and received in the tubular cover 14, and one end of each of the main units projects from an end of the tubular cover 14.

The circumferential surface of the first main unit 12a is divided along the circumferential direction into four areas; namely, an operation area in which operation buttons 54 are arranged, a battery placement area in which a battery placement hole 20 is formed, a medium placement area in which a medium placement hole 18 is formed, and a blank area which is exposed to the outside when the portable audio player is carried around. In an outer peripheral wall of the tubular cover 14, a first opening 30a for exposing only one of these four areas to outside is formed. FIG. 7A shows a state in which the operation area is exposed, FIG. 7B shows a state in which the battery placement area is exposed, and FIG. 7C shows a state in which the medium placement area is exposed, each via the first opening 30a.

In the circumferential surface of the second main unit 12b, one display 16 for displaying an operation status is provided alone. That is to say, among the entire circumferential surface of the second main unit 12b, the portion in which this display 16 is arranged is a display area, and the remaining portion constitutes a blank area in which no protection target element is arranged. In the outer peripheral wall of the tubular cover 14 at a portion axially adjacent to the first opening 30a, a second opening 30b for exposing the display area or the blank area of the second main unit 12b is formed.

The first main unit 12a and the second main unit 12b are rotatable relative to the tubular cover 14, independently of each other. By configuring such that the two main units 12 are independently rotatable, the area to be exposed in the first main unit 12a can be switched while the display 16 of the second main unit 12b is kept exposed to the outside.

When the portable audio player 60 is to be carried around, the first main unit 12a is rotated relative to the tubular cover 14 so as to expose the blank area of the first main unit 12a to the outside via the first opening 30a, and similarly, the second main unit 12b is rotated relative to the tubular cover 14 so as to expose the blank area of the second main unit 12b to the outside via the second opening 30b. By doing so, the operation area, the battery placement area, the medium placement area, and the display area are covered and protected by the tubular cover 14. In other words, according to the present embodiment too, a plurality of protection target elements can be protected simultaneously using a single tubular cover 14, and easily breakable structures such as a hinge structure and a claw structure can be eliminated.

Although the first main unit 12a and the second main unit 12b are configured as completely independent units in the present embodiment, it is alternatively possible to configure such that, for example, when the first main unit 12a is rotated to expose the blank area of the first main unit 12a, the second main unit 12b rotates in association with the first main unit 12a to expose the blank area of the second main unit 12b. Further, the second main unit 12b may be provided with a plurality of function elements. The number of equally divided areas, the function elements to be arranged, and the order of arrangement thereof may be changed according to product format, as in the first and the second embodiments.

Furthermore, although two main units are provided in the present embodiment, a greater number of main units may be arranged adjacently along the axial direction while being rotatable independently from one another. It is noted that the techniques of the first through third embodiments are applicable to other types of electronic devices, such as cellular phones, wearable computers, and digital cameras, so long as the electronic devices are transportable.

The invention claimed is:

1. A transportable electronic device, comprising:
   a cylindrical main unit that is divided into two or more areas along a circumferential direction, the cylindrical main unit having a circuit board therein; and
   a tubular cover that houses at least a part of the main unit and protects a circumferential surface of the main unit by covering the circumferential surface of the main unit, the tubular cover having an opening formed in its circumferential surface for exposing one or more of said areas to the outside,
   wherein the tubular cover is rotatable relative to the main unit so that an area to be covered and protected by the tubular cover can be switched, and
   wherein the main unit at least has:
      a protection area including a protection target element that is electrically connected to the circuit board; and
      a blank area in which no protection target element is arranged, which can be exposed to the outside via the opening when the transportable electronic device is carried around, and which has a larger width in a circumferential direction than the opening,
      wherein the blank area and the protection area are aligned in the circumferential direction.

2. The transportable electronic device according to claim 1, wherein
   the main unit has two or more protection target areas in each of which a protection target element is arranged, and
   the tubular cover functions as a protective cover that simultaneously protects said two or more protection target areas.

3. The transportable electronic device according to claim 1, wherein
   the main unit is provided in a plural number and arranged adjacently along an axial direction of the tubular cover, and
   in the tubular cover, respective openings corresponding to each of the plurality of main units are provided adjacently along the axial direction.

4. The transportable electronic device according to claim 1, wherein the main unit at least has a placement area in which an item is placed as a protection target element.

5. The transportable electronic device according to claim 1, wherein the main unit at least has a display area in which a display is arranged as a protection target element.

6. The transportable electronic device according to claim 1, wherein the main unit at least has an operation area in which an operation unit is arranged as a protection target element.

7. The transportable electronic device according to claim 1,
   wherein the tubular cover includes a first end that is closed and a second end that is open, and an end of the main unit projects from the tubular cover through the second end of the tubular cover,
   wherein an annular rib is disposed within the tubular cover and protrudes from the first end of the tubular cover,
   wherein one or more recesses are formed in the annular rib, and
   wherein one or more latches extend from the cylindrical main unit toward the annular rib.

8. The transportable electronic device according to claim 7, wherein at least part of an outer peripheral wall of the main unit is arranged between the annular rib and an outer peripheral wall of the tubular cover.

9. The transportable electronic device according to claim 8, wherein the annular rib is arranged concentrically with the outer peripheral wall of the tubular cover.

10. The transportable electronic device according to claim 7, wherein one or more springs bias the one or more latches toward the annular rib.

* * * * *